(12) United States Patent
Chen

(10) Patent No.: US 7,121,858 B2
(45) Date of Patent: Oct. 17, 2006

(54) SOCKET FOR BALL GRID ARRAY DEVICES

(75) Inventor: Ming-Yu Chen, Tu-Cheng (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 11/224,401

(22) Filed: Sep. 12, 2005

(65) Prior Publication Data

US 2006/0057868 A1    Mar. 16, 2006

(30) Foreign Application Priority Data

Sep. 10, 2004    (TW) .............................. 93127471 A

(51) Int. Cl.
*H01R 13/15*    (2006.01)

(52) U.S. Cl. ......................................... 439/259; 439/71

(58) Field of Classification Search .............. 439/259, 439/68, 71, 482, 73, 857
See application file for complete search history.

(56) References Cited

U.S. PATENT DOCUMENTS

| | | | | |
|---|---|---|---|---|
| 5,919,050 A | * | 7/1999 | Kehley et al. | 439/71 |
| 6,261,114 B1 | * | 7/2001 | Shimada | 439/266 |
| 6,375,476 B1 | * | 4/2002 | Goodwin et al. | 439/71 |
| 6,426,553 B1 | * | 7/2002 | Inomata | 257/727 |
| 6,500,017 B1 | * | 12/2002 | Hayakawa | 439/268 |

* cited by examiner

*Primary Examiner*—Tho D. Ta
*Assistant Examiner*—Vanessa Girardi
(74) *Attorney, Agent, or Firm*—Wei Te Chung

(57) ABSTRACT

Disclosed is a socket (10) including a base (12), an array of contacts (22) in columns and rows, a plurality of positioning blocks (121) between the rows of the contacts of the base. Each of the contacts includes two deflectable contact pieces (223) at a distal region thereof to capture one ball (200) of an IC device (20) in a manner to prevent movement of that ball in a first horizontal direction. Some of the positioning blocks are arranged for preventing movement of balls of the IC device in a second horizontal direction substantially perpendicular to the first horizontal direction. Thus, the IC device may be accurately positioned on the test socket.

17 Claims, 6 Drawing Sheets

SOCKET FOR BALL GRID ARRAY DEVICES

BACKGROUND OF THE INVENTION

1. Field of the Invention

The present invention relates generally to sockets for connection of an integrated circuit (IC) device to a circuit substrate, and, more particularly, a socket having a positioning mechanism for ball grid array (BGA) devices.

2. Background of the Invention

Integrated circuit (IC) devices, specially ball grid array (BGA) devices, are widely used in the electronics industry. The BGA devices are important components of the electronics industry, with solder balls formed on at least one planar surface thereof. In general, before one of the BGA devices is bonded to an end product of a circuit board, it is required to be tested to determine whether this BGA device is functioning, and whether electrical continuity is present between various portions of the BGA device. To do a test, the BGA device is placed in a socket attached to a circuit substrate. The assembly of the circuit substrate and the IC device should also be subjected to a high temperature of up to about 125 degree while the IC device is being electrically tested.

To withstand such a high temperature in testing, the IC device must be secured in the socket by suitable positioning members. One of the well-known positioning members is called "an IC device adaptor". The IC device adaptor has a relatively complex shape with a substantially rectangular-shaped frame defined in the central thereof. The frame is shaped and sized to mate with the BGA device, so that the BGA device is retained in the socket by engagement of sides of the frame and the BGA device.

However, when an additional type of BGA device is present, the IC device adaptor of the socket must be redesigned in shape and size to mate with the additional BGA device. In other words, one type of IC device adaptor is merely applicable to one type of BGA device. Therefore, a great number of types of IC device adaptors of the socket, acting as positioning members for the BGA sockets, are required because there are more favorable types of BGA devices to be emerged in addition to the existing BGA devices. This will directly and indirectly result in much more complexity and additional cost added to the overall design and manufacturing of the test sockets.

In view of the above, it is strongly desired to provide a new socket to overcome the above-mentioned disadvantages.

SUMMARY OF THE INVENTION

In embodiments of the present invention, a socket for connection of a ball grid array integrated circuit (IC) device to a circuit board is provided, wherein the IC device has an array of conductive elements with circular cross-section shapes in a predetermined plane. The socket includes a socket body, a plurality of contacts on the socket body and a plurality of protrusions positioned between the contacts of the body socket. The contacts at least includes an array of contacts for corresponding to the array of conductive elements of the IC device. Some of the contacts each may include at least two deflectable contact pieces at a distal region thereof to receive one corresponding conductive element of the IC device in a manner to prevent movement of that conductive element in at least a first direction but not in a second direction. The plurality of protrusions at least includes some of the protrusions, so that, when the IC device mates with the test socket, these protrusions are arranged for preventing movement of conductive elements of the IC device in at least the second direction but not in the first direction. Thus, the protrusions and the contacts together constitute a means for positioning the array of conductive elements of the IC device in the predetermined plane.

Therefore, through suitable configurations of protrusions and the contacts, various types of BGA devices having different arrays of conductive elements with circular cross-section shapes may be securely maintained within the socket. Therefore, complexity and cost associated with the design and manufacturing of the test socket may be increasingly reduced.

Other features and advantages of embodiments of the present invention will become more apparent to those skilled in the art upon examination of the following drawings and detailed description of preferred embodiments, in which:

DETAILED DESCRIPTION OF THE PREFERRED EMBODIMENTS

Figure 1:
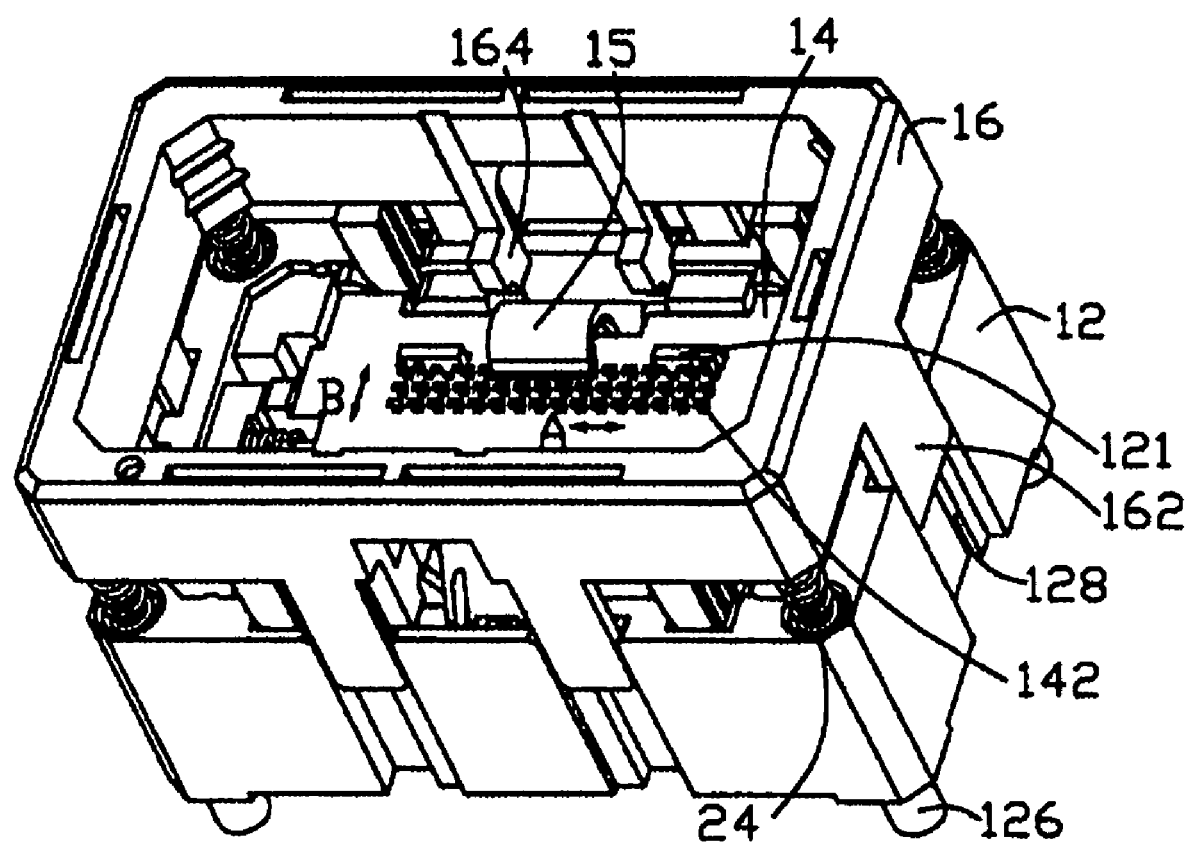
FIG. 1 is an assembled, isometric view of a socket in accordance with a first preferred embodiment of the present invention.

Reference will now be made to describe preferred embodiments of the present invention in detail.

As shown in FIGS. 1 to 5, a test socket 10 in accordance with a first preferred embodiment of the present invention is shown to connect a ball grid array integrated circuit (IC) device 20, especially a BGA package, with a circuit board (not shown), especially a test circuit.

The socket 10 includes a base 12, an upper movable plate 14, an actuating member 16, a lower plate 18, a bottom safeguard board 20 and a plurality of contacts or terminals 22 assembled on the base 12. The contacts 22 are arranged to extend through the upper movable plate 14, the base and the lower plate 18, respectively. The upper movable plate 14 has locking member 15 adapted to be engagable with the base 12 for positioning the IC device in a vertical direction. The actuating member 16 is adapted for driving the locking member 15 to be engagable with the IC device 20. On the bottom surface of the base 12 is disposed the lower plate 18, which in turn has the bottom safeguard board 20 for preventing potential damages to the contacts 22 extending out of the lower plate 18. Herein, the base 12, the upper movable plate 14 and the lower plate 18 can be considered as part of the socket body (not labeled) of electrically insulative material.

Figure 5:
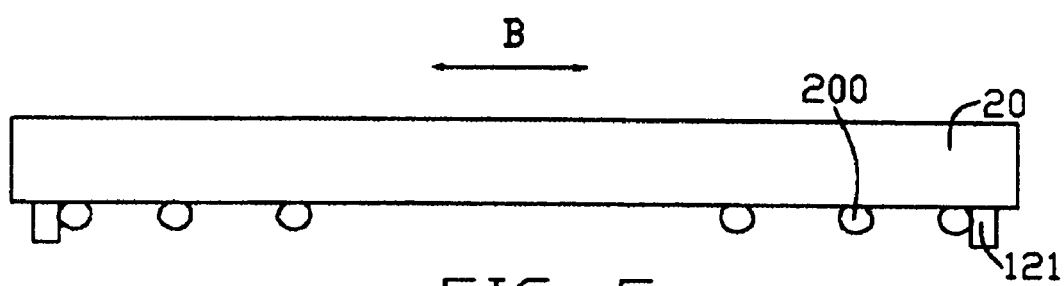
FIG. 5 is a part and cross section view of the socket of FIG. 1, showing outside rows of the balls of the test circuit retained by protrusions of the socket, respectively.

The base 12 is generally molded from resin or the like and shaped in the form of a rectangular frame. A generally rectangular cavity 120, for receiving the upper movable plate 14, is defined in a middle portion of the base 12. A plurality of first passageways 122, generally in an array of columns and rows, is defined in the middle portion of the base 12 and under the first cavity 120, for accommodating the respective contacts 22 therein. Four separate positioning blocks 121, each having a common predetermined height thereof, extend upwardly from four corners of the array and abut against the outside rows of first passageways 122 of the base 12, respectively. As shown in FIG. 5, when the balls 200 of the IC device 20 engage with the respective contacts 22 of the test socket 10, this arrangement of positioning blocks 121 prevents the movement of the corresponding outside rows of balls 200 of the IC device 20 in a second horizontal direction, indicated by an arrow B, with respect to the base 12. Alternatively, in some embodiments, a plurality of discrete blocks or protrusions 121 may be arranged between any other rows of first passageways 122 of the base 12 to prevent movement of some balls 200 or some rows of balls 200 of the IC device 200 in the second horizontal direction of B. Accordingly, the test socket 10 can be designed to have any other suitable configurations of protrusions 122 to mate with an additional IC device having a different array of conductive elements with circular cross-section shapes.

In addition, around the cavity 120 of the base 12 are a top wall, a bottom wall, and lateral sidewalls extending between the top wall and the bottom wall (not labeled). Four first receiving holes 124, which are adapted for receiving corresponding springs 24 and first positioning posts 161 of the actuating member 16, are respectively defined in the corners of the top wall. Further, the bottom wall has four second positioning posts 126 respectively extending downwardly from the corners thereof, so that the socket 20 is fastened to the circuit board (not shown) by the second positioning posts 126. The base 12 includes at least a pair of stepped grooves 128 respectively on opposed lateral sidewalls of the base 12, for engaging with tabs 162 of the actuating member 16.

The upper movable plate 14 has a generally rectangular frame, which is shaped and sized to be accommodated within the cavity 120 of the base 12. A pair of spaced holding elements 146, such as hooks or catches, extend downwardly from each of opposite sidewalls of the upper plate 14, so as to be engagable with the base 12 by such holding elements 146. A recessed section 148 is formed between each pair of holding elements 146, so that a locking member 15 can be received in the recessed section 148, for engaging with the IC device 20 placed on the upper plate 14 and thereby preventing movement of the IC device 20 in a vertical direction with respect to the base 12. The upper movable plate 14 also has an array of second passageways 142 in the middle portion thereof with four block receiving slots 144, which is adapted for receiving the respective positioning blocks 121 of the base 12.

The actuating member 16 is also of a generally rectangular shape with a first central window 160 thereof. A pair of spaced pressing portions 164, for corresponding to one locking member 15, extend downwardly from each of opposite sidewalls of the window 160, so that the locking member 15 of the upper plate 14 can be driven by the pressing portions 164 from a closed position, where the locking member 15 may be engagable with the upper movable plate 14 or the IC device 20 placed on the upper plate 14, to an opened position, where the locking member 15 may be disengaged with the upper movable plate 14 or the IC device 20 placed on the upper plate 14. Between each pair of the pressing portions 164 is formed a second window 163 for accommodating the locking member 15. In addition, the actuating member 16 also has a pair of tabs 162, to be engagable with the grooves 128 of the base 12, and four first positioning posts 161, to be insertable into the respective receiving holes 124 with the springs 24 received therein.

The lower plate 18 and the bottom safeguard board 20 each have a plurality of passageways 182, 202 just consistent with the passageways 122, 142. The lower plate 18 is fastened to the base 12 by suitable fastening means, such as screws (not shown). The bottom board 20 has a pair of stepped retention portions 204 respectively extending upwardly from opposite sides thereof so as to engage with the lower plate 18 by such retention portions 204.

Figure 3:
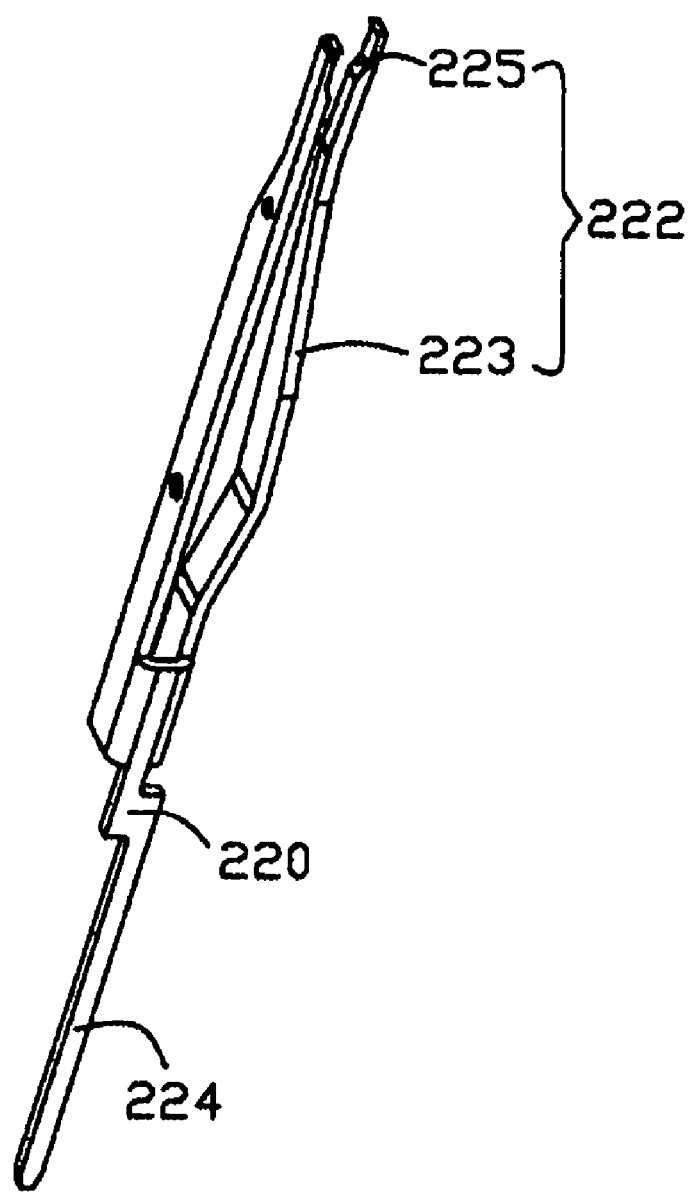
FIG. 3 is an isometric view of one contact of the socket of FIG. 1.
Figure 4:
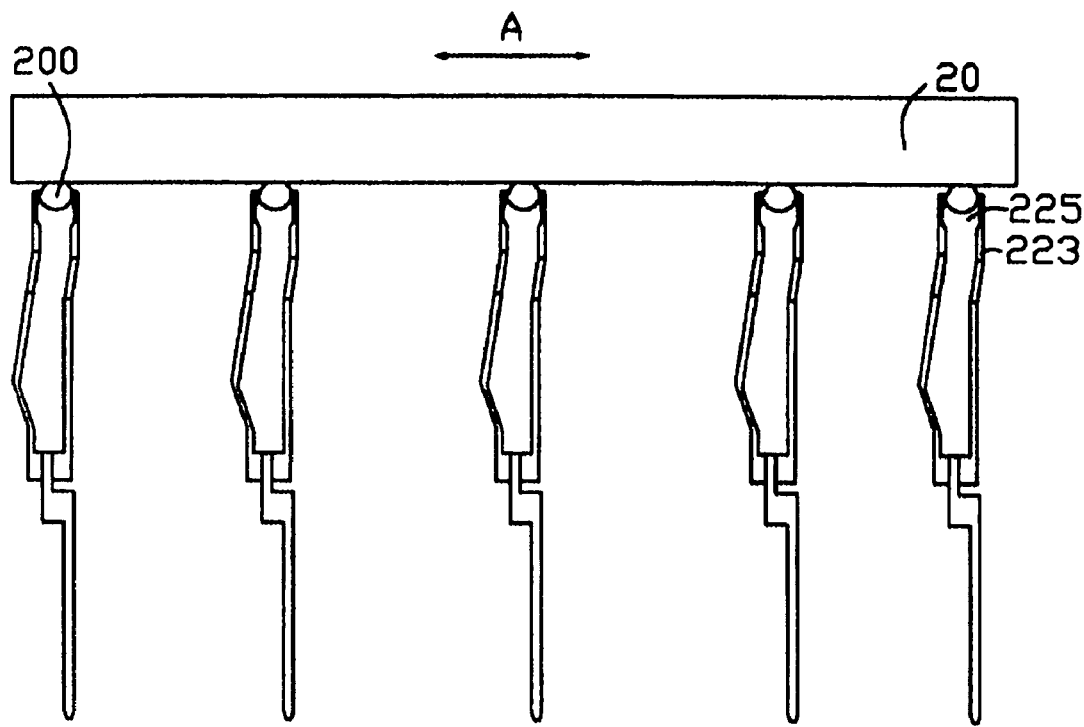
FIG. 4 is a part and cross section view of the socket of FIG. 1, showing rows of the balls of the test circuit captured by a portion of a plurality of contacts of the socket, respectively.

Referring also to FIG. 3, the contact 22 has a base section 220 mounted on the base 220, an upwardly extending section 222 and a downwardly extending section 224, wherein the upwardly extending 222 partially extends through the passageway 142 and out of the upper surface of the movable plate 14, and the downwardly extending 224 is insertable into the circuit board via the respective passageways 182, 202. More specially, the upwardly extending 222 includes two deflectable cantilever arms 223 arranged to be biased toward each other, and further form an angled receptacle 225 at a distal region thereof, from a side view thereof, to capture one ball 200 of the IC device 20. As shown in FIG. 4, engagement of rows of the balls 200 of the IC device 20 with the corresponding rows of the contacts 22 prevents the movement of the IC device 20 in a first horizontal direction, indicated by an arrow A, with respect to the base 12, the first horizontal direction of A substantially perpendicular to the second horizontal direction of B. Alternatively, in other embodiments, the plurality of contacts 22 of the base 12 may include some contacts 22 each defining at least two opposed deflectable contact pieces to receive the corresponding balls 200 of the IC device 20 so as to prevent movement of the IC device 20 in the first direction of A. In addition, it should be understood that each or some of the contacts 22 can be configured to have any other shapes or configurations, e.g. contact with at least one angled contact pieces or having a recessed region, provided that those kinds of contacts can also serve to receive the balls 200 of the IC device 20 to prevent movement of the IC device 20 in the first direction. Examples of similar contacts are found in U.S. Pat. No. 5,685,725, JP Pat. No. 2,909,068 and JP Patent Application 2002-357622, all of which are incorporated herein by reference. From the above description, the test socket 10 may be designed to have suitable shapes or configurations of contacts 22 to mate with an additional IC device having a different array of conductive elements with circular cross-section shapes.

Figure 2:
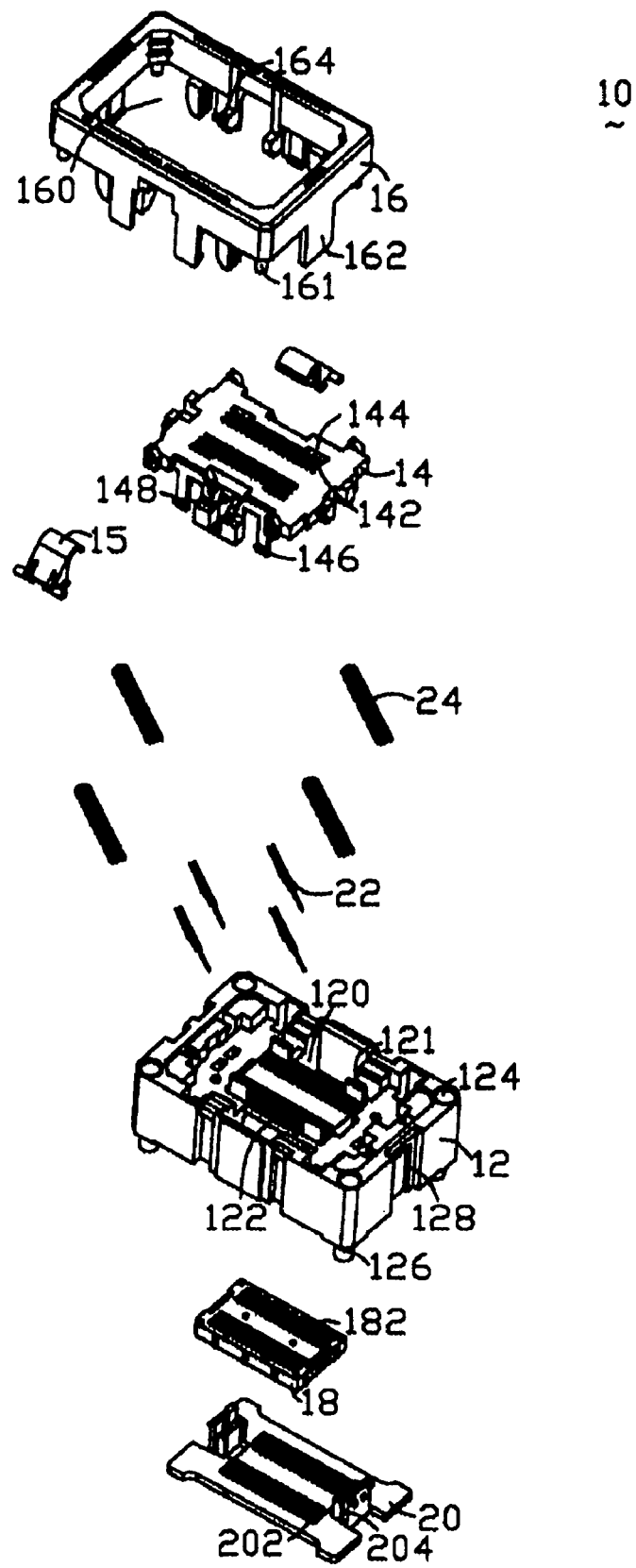
FIG. 2 is an exploded, isometric view of the socket of FIG. 1.

Referring to FIGS. 1 to 3, in one assembly, the locking members 15 are respectively inserted into the recessed sections 148 of the upper plate 14. The upper plate 14 is mounted onto the cavity 120 of the base 12 by the holding elements 146, and the positioning blocks 121 passing through the respective slots 144 of the upper plate 14. The lower plate 18 is fastened to the base 12 by screws. Then, the contacts 22 are inserted, in sequence, into the respective passageways 142, 122, 182, so that the base section 220 of each of the contacts 22 is mounted in the passageways 122 of the base 12, the downwardly extending section 224 thereof extends through the passageway 182 of the lower plate 18, and the upwardly extending section 222 thereof extends through the passageway 142 and partially out of the upper surface of the upper plate 14. The bottom board 20 is tightened to the lower plate 18 by retention portions 204 so as to prevent damages to the contacts 22. Finally, the actuating member 16 is mounted onto the base 12 by positioning posts 161 insertable into the respective holes 124, the holes 124 having springs 24 received therein, and tabs 162 engagable with the grooves 128 of the base 12. When no force is exerted on the actuating member 16, the actuating member 16 is supported by the springs 24 of the receiving holes 124 to be positioned at a top position.

During one operation of the socket 10, the actuating member 16 is driven to move downwardly by exerted force thereon. When the actuating member 16 is moved to a position where the pressing portions 164 thereof engage with the locking members 15, the locking members 15 is caused from the closed position to the opened position by pressing the pressing portions so as to permit the IC device 20 to be loaded therein. As best shown in FIGS. 3 and 4, when the IC device 20 having different columns of solder balls 200 thereof is loaded and mates with the contacts 22 of the socket 10, the balls 200 of the IC device 20 are respectively captured by one array of contacts 22 of the plurality of contacts 22 of the socket 10 so as to prevent movement of balls 200 of the IC device 20 in the first horizontal direction of A with respect to the base 12. And the positioning blocks 121 are arranged to prevent movement of the outside rows of balls 200 of the IC device 20 in the second horizontal direction of B, the second horizontal direction of B substantially perpendicular to the first horizontal direction of A. Meanwhile, the locking members 15 are utilized to position the IC device 20 in the vertical direction with respect to the socket 10. Thus, the IC device 20 having different columns of conductive elements with circular cross-section shapes may be accurately positioned within the socket 10.

Figure 6:
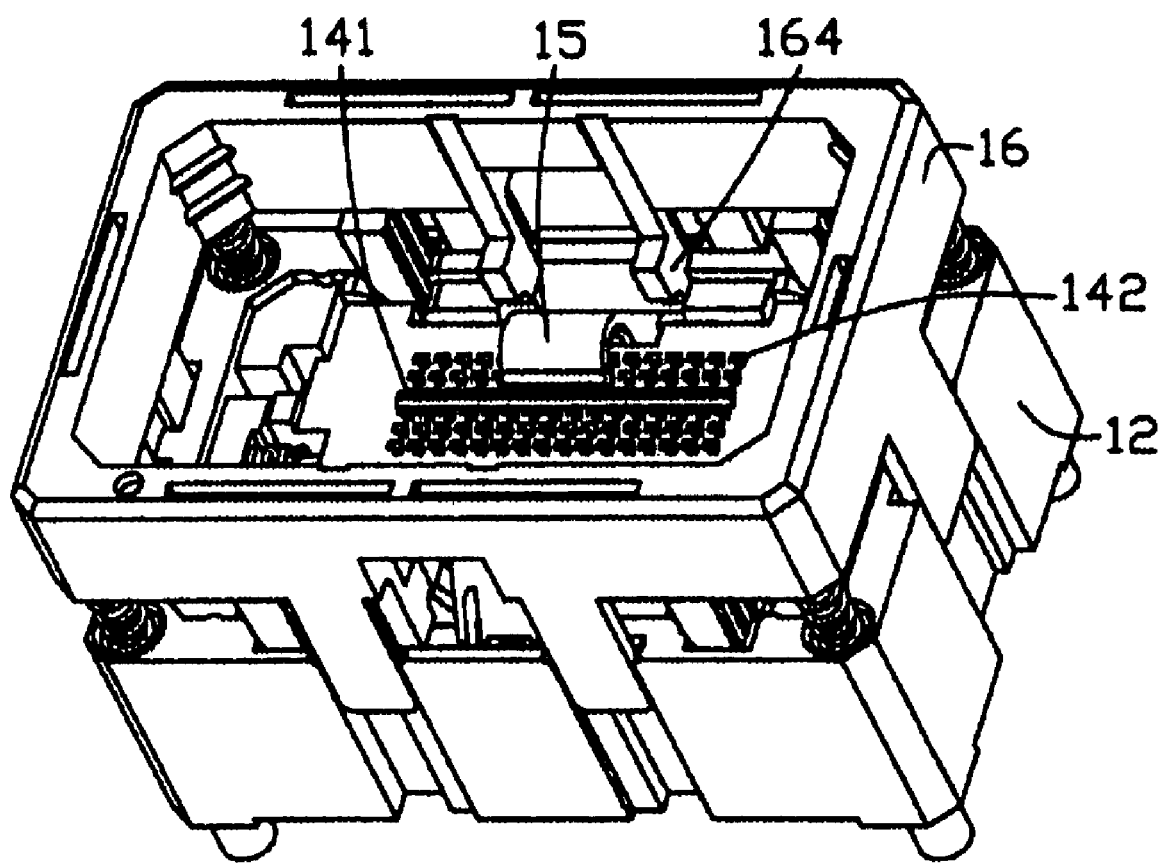
FIG. 6 is an assembled, isometric view of a socket in accordance with a second embodiment of the present invention.

FIG. 6 shows another socket 10' according to a second preferred embodiment of the present invention. Similar to the configuration of the socket 10 in the first preferred embodiment, the socket 10' also includes the base 12, the upper movable plate 14, the locking member 15 and the actuating member 16. What's mainly different from the socket 10 of the first embodiment, is that the socket 10' has opposite elongated strips 141 disposed at the upper movable plate 14, rather than at the base 12, and between middle rows of the array of passageways 142, respectively. The strips 141 is designed to have a common predetermined height, substantially equal to that of the positioning block 121 of the base 12. It should be noted that, when an additional IC device, having different rows of solder balls thereof, mates with the contacts 22 of the socket 10', the strips 141 may be arranged to prevent movement of any two rows of solder balls 200, rather than the outside rows of solder balls 200, of the IC device 20 in the second horizontal direction of B. Accordingly, additional IC devices having different rows of conductive elements with circular cross-section shapes may be accurately positioned within the socket 10'.

As stated above, the strips 141 mainly function as positioning mechanism for the IC device 20 in the second direction of B. In some situations, the strips 141 may also simultaneously serve as a guiding member for the IC device 20 to be accurately placed on a predetermined region of the socket 10', or as an engagement member for other suitable elements to be engaged thereon.

Therefore, from the detailed description of the preferred embodiments of the present invention, it should be clearly understood that, the socket can be configured to have suitable configurations of the positioning protrusions and the contacts to mate with various types of IC devices having different arrays of conductive elements with circular cross-section shapes.

Figure 7:
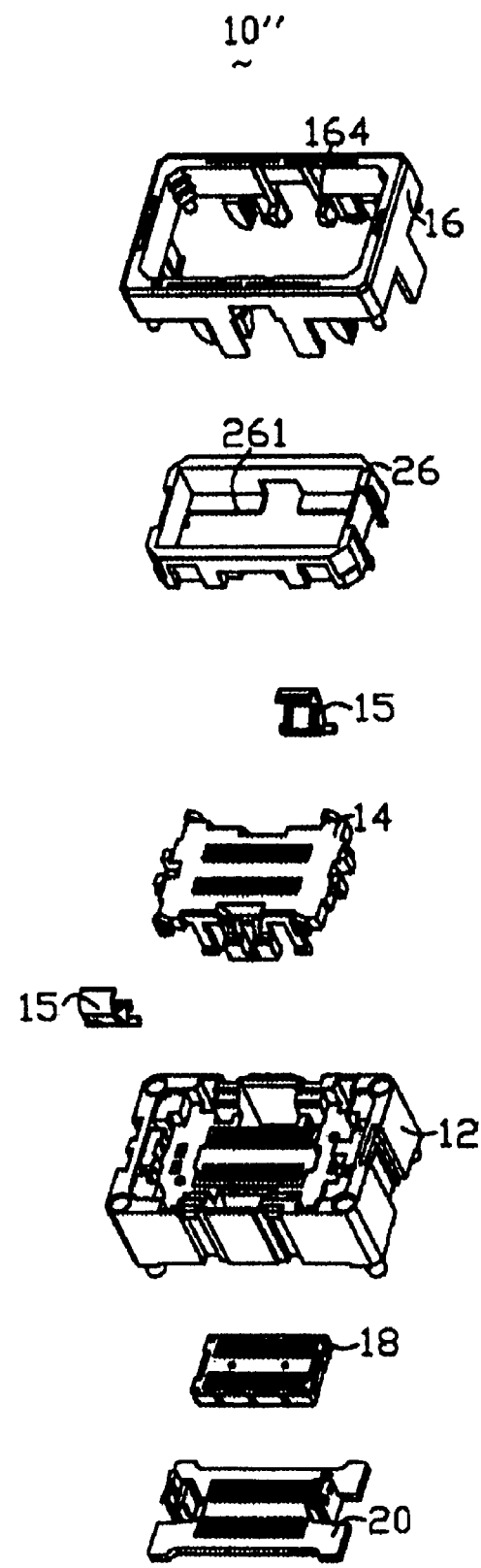
FIG. 7 is an exploded, isometric view of a socket in accordance with a third embodiment of the present invention.

FIG. 7 shows still another socket 10'' according to a third embodiment of the present invention. Similar to the configuration of the socket 10 in the first preferred embodiment, the socket 10'' also includes the base 12, the upper movable plate 14, the locking member 15 and the actuating member 16. But an additional rack 26 is provided between the upper plate 14 and the actuating member 16 to achieve the position of the IC device 20 in the second direction of B. The rack 26 has a pair of planar retention plates 261 respectively extending from opposite sides of the bottom thereof, so that the IC device 20 is positioned in the second direction of B by engagement of the retention plates 261 with the outside rows of the balls 200 of the IC device 20 placed on the upper plate 14.

While the present invention has been described with reference to specific embodiments, the description of the embodiments is illustrative, but not to be construed as limiting the invention. Various of modifications to the present invention can be made to the preferred embodiments by those skilled in the art without departing from the true spirit and scope of the invention as defined by the appended claims.

What is claimed is:

1. A test socket for connection of a ball grid array integrated circuit (IC) device to a test circuit, the IC device having an array of solder balls thereof, the test socket comprising:
   a socket body;
   a plurality of terminals on the socket body, the plurality of terminals at least comprising an array of terminals in columns and rows, for corresponding to the array of solder balls of the IC device, some of the array of the terminals each including at least two deflectable contact pieces at a distal region thereof to capture one corresponding ball of IC device to prevent movement of that ball in a first horizontal direction;
   a retention member on the socket body, the retention member having at least one retention side thereof;
   wherein, when the IC device mates with the socket, the at least one retention side of the retention member is adapted to engage with at least a portion of peripheral surfaces of the balls of the IC device so as to prevent movement of the IC device in a second horizontal direction substantially perpendicular to the first horizontal direction, and thus, the terminals and the retention member together constitute a means for positioning the IC device in a predetermined plane defined by the first and second horizontal direction.

2. The test socket as claimed in claim 1, wherein the retention side is a horizontal plate disposed adjacent one of the outside rows of the array of the terminals.

3. The test socket as claimed in claim 1, wherein the retention member includes a pair of retention sides respectively disposed between rows of the array of the terminals.

4. The test socket as claimed in claim 3, wherein the pair of retention sides is respectively disposed at opposite outside rows of the array of the terminals.

5. The test socket as claimed in claim 3, wherein at least one of the pair of retention sides is a block extending vertically and upwardly from the socket body.

6. A socket for connection of a ball grid array integrated circuit (IC) device to a circuit board, the IC device defining an array of conductive elements with circular cross-section shapes in a predetermined plane, the socket comprising:
- a socket body;
- a plurality of contacts on the socket body, the contacts at least comprising an array of contacts corresponding to the array of conductive elements of the IC device, at least some of the contacts each defining a recessed region at a distal portion thereof to receive one corresponding conductive element of the IC device in such a manner as to prevent movement of that conductive element in at least a first direction but not in a second direction;
- a plurality of positioning pieces between the contacts of the socket body;

wherein, when the IC device mates with the socket, the plurality of positioning pieces at least comprises some of the positioning pieces arranged for preventing movement of conductive elements of the IC device in at least the second direction but not in the first direction, and thus, the contacts and the positioning pieces together constitute a means for positioning the array of conductive elements of the IC device in the predetermined plane.

7. The socket as claimed in claim 6, further comprising a locking member on the socket, the locking member is adapted for engaging with the IC device to position the IC device in a direction substantially perpendicular to the predetermined plane.

8. The socket as claimed in claim 6, wherein some of the positioning pieces each are arranged to engage with at least a portion of a peripheral surface of the conductive element so as to prevent movement of the IC device in the second direction.

9. The socket as claimed in claim 6, wherein some of the positioning pieces are arranged between rows of the array of the contacts of the socket body.

10. The socket as claimed in claim 9, wherein the positioning pieces include a plurality of separate protrusions.

11. The socket as claimed in claim 10, wherein at least a pair of spaced protrusions is disposed at two ends of each of the outside rows of the array of the contacts, respectively.

12. The socket as claimed in claim 9, wherein the positioning pieces include a plurality of strips between rows of the array of the contacts.

13. The socket as claimed in claim 12, wherein at least a pair of elongated strips disposed at the outside rows of the array of the contacts, respectively.

14. The socket as claimed in claim 6, wherein some of the contacts each include at least two deflectable contact pieces, the recessed region is configured by the at least two deflectable contact pieces.

15. The socket as claimed in claim 14, wherein each of the array of the contacts includes at least two deflectable contact pieces at a distal region thereof to capture one corresponding conductive element of the IC device to prevent movement of that conductive element in the first horizontal direction.

16. A socket assembly comprising:
- a ball grid array integrated circuit (IC) device defining an array of conductive elements with circular cross-section shapes in a predetermined plane;
- a socket body;
- a plurality of contacts associated with the socket body with tip sections corresponding to the array of conductive elements of the IC device;
- means formed on the said tip sections and engaged with the corresponding conductive elements for elastically while restrictively preventing the corresponding conductive elements from moving in a first direction;
- means, which is not formed on the contacts but engaged with the corresponding conductive elements, for restrictively preventing the corresponding conductive elements from moving in a second direction different from the first direction.

17. The socket assembly as claimed in claim 16, wherein said means formed not on the contacts provides relatively rigid restriction upon the corresponding conductive elements in comparison with the means which are formed on the contacts.

* * * * *